(12) United States Patent
Wang et al.

(10) Patent No.: US 7,324,368 B2
(45) Date of Patent: Jan. 29, 2008

(54) INTEGRATED CIRCUIT MEMORY WITH WRITE ASSIST

(75) Inventors: Karl Lin Wang, Los Altos, CA (US); Hemangi Umakant Gajjewar, Santa Clara, CA (US)

(73) Assignee: ARM Limited, Cambridge (GB)

( * ) Notice: Subject to any disclaimer, the term of this patent is extended or adjusted under 35 U.S.C. 154(b) by 112 days.

(21) Appl. No.: 11/392,961

(22) Filed: Mar. 30, 2006

(65) Prior Publication Data

US 2007/0236983 A1 Oct. 11, 2007

(51) Int. Cl.
*G11C 11/00* (2006.01)

(52) U.S. Cl. .................................... 365/154; 365/156
(58) Field of Classification Search ................ 365/154, 365/156, 230.05
See application file for complete search history.

(56) References Cited

U.S. PATENT DOCUMENTS

| | | | | |
|---|---|---|---|---|
| 5,267,197 | A | * | 11/1993 | McClure ................ 365/189.01 |
| 5,764,564 | A | * | 6/1998 | Frake et al. ................ 365/154 |
| 6,788,566 | B1 | * | 9/2004 | Bhavnagarwala et al. .. 365/154 |
| 6,804,143 | B1 | * | 10/2004 | Hobson ........................ 365/154 |

OTHER PUBLICATIONS

Zhang et al., "A 3-GHz 70Mb SRAM in 65nm CMOS Technology with Integrated Column-Based Dynamic Power Supply", 2005 IEEE International Solid-State Circuits Conference, Session 26, Non-Volatile Memory, 26.1, pp. 474-475, 611, Feb. 9, 2005.

Yamaoka et al., "Low Power Embedded SRAM Modules with Expanded Margins for Writing", 2005 IEEE International Solid-State Circuits Conference, Session 26, Static Memory, 26.4, pp. 480-481, 611, Feb. 9, 2005.

* cited by examiner

*Primary Examiner*—Anh Phung
(74) *Attorney, Agent, or Firm*—Nixon & Vanderhye P.C.

(57) ABSTRACT

An integrated circuit memory includes memory cells 2 is connected to a power supply Vdd via a power supply control circuit 4. The power supply control circuit includes a first gate 26 and a second gate 28. The first gate 26 is switched by a write assist circuit so as to be non-conductive when writing to the memory cell 2. The second gate 28 is conductive both when writing to the memory cell 2 and when not writing to the memory cell 2. Accordingly, when a write operation is made a relatively high resistance path is formed through the power supply control circuit 4 compared to when writing is not being performed. This increase in the resistance through the power supply control circuit 4 during write operations induces a dip in the virtual supply voltage provided at the supply output of the power supply control circuit 4 in a manner which assist writes to be made. If individual memory cells 2 tend to resist changes in their state more strongly, then they will tend to draw more current which will in turn result in a larger virtual supply voltage dip which will assist more strongly in encouraging those memory cells 2 to change state.

26 Claims, 8 Drawing Sheets

INTEGRATED CIRCUIT MEMORY WITH WRITE ASSIST

BACKGROUND OF THE INVENTION

1. Field of the Invention

This invention relates to the field of integrated circuit memories. More particularly, this invention relates to write assist mechanisms for use within integrated circuit memories to allow data values to be more readily written.

2. Description of the Prior Art

It is known to provide integrated circuit memories with write assist mechanisms to enable data values to be more readily written to the memory cells. One known system uses two power supply rails connected by respective gates to each memory cell to be written. A first of these power supplies is used to power the memory cell in modes other than a write mode and utilises a relatively high supply voltage level. The second power supply has a lower voltage level and is used during write operations to power the memory cell. The lower supply voltage used during such write operations enables the memory cell to be more readily written. A disadvantage with this approach is that two separate power rails need to be routed through the memory, which uses a disadvantageous amount of space. Furthermore, the switching between these two power supplies is relatively slow such that it is difficult to rapidly switch from writing a memory cell to reading that same memory cell or a memory cell connected to the same power supply.

Another known approach to providing a write assist mechanism is using the memory cell with a gated power supply from a single source. When operating other than to perform a write, the memory cell is supplied with power through the gate. When it is desired to write to that memory cell, the gate isolates the memory cell from the power supply such that the memory cell is unpowered during the write operation. This makes it easier for a new data value to be written into the memory cell. Memory cells are not normally provided with individually controllable power supplies since this would consume a disadvantageous number of gates and reduce the memory density. Rather, a group of memory cells usually share a power supply line, which may be a virtual power supply line separated by a gate from a permanently powered power supply line in accordance with this technique. However, when multiple memory cells share a power supply in this way, all of these memory cells will be isolated from the power supply and be unpowered whilst one of the memory cells is being written. This will leave the unpowered memory cells vulnerable to data loss. This risk is increased when one considers manufacturing and process variations which can occur rendering individual memory cells particularly vulnerable to data loss when unpowered. This approach suffers from the disadvantage of potentially rendering a memory unreliable.

SUMMARY OF THE INVENTION

Viewed from one aspect the present invention provides an integrated circuit memory comprising:

at least one memory cell having a first state and a second state corresponding to storage of different values of a data bit; and a power supply control circuit operable to supply power to said at least one memory cell and having a supply input coupled to a power source and a supply output coupled to said at least one memory cell; wherein said power supply control circuit includes at least a first gate and a second gate and is responsive to a write assist signal to switch at least one of said first gate and said second gate such that:

when not writing to said at least one memory cell said power supply control circuit provides a low resistance path between said supply input and said supply output; and when writing to said at least one memory cell said power supply control circuit provides a high resistance path, with a resistance greater than said low resistance path, between said supply input and said supply output so that said at least one memory cell is more readily switched between said first state and said second state.

In accordance with the present technique a memory cell is provided with power via a power supply control circuit including at least two gates which are switched by a write assist signal to provide either a low resistance or high resistance path through the power supply control circuit. Thus, the memory cell is always powered and connected to the power supply, but when the high resistance path is in use during writing to the memory cell, then this will effectively weaken the power supply to the memory cell such that it is easier for a new data value being written into that memory cell, i.e. to change the state of the memory cell and overcome the inherent stability in the memory cell which tends to oppose changes in its state. This technique does not require separate power supply lines to be routed through the memory structure and does not leave the memory cell isolated from the power supply in a way which renders it vulnerable to inadvertent data loss.

It will be appreciated that the first gate and the second gate within the power supply control circuit could be controlled in a variety of different ways by the write assist signal. A preferred way of controlling the first and second gates is that the first gate is switched to a conductive state by the write assist signal when not writing to the memory cell and is switched to a non-conductive state by the write assist signal when writing to the memory cell. Thus, whatever contribution is being made to the strength of the power supply to the memory cell by current passing through the first gate, this is removed when writing to the memory cell. The second gate can be permanently conductive and supply a relatively weak power supply to the memory cell during writing such that the memory cell will not inadvertently lose data if it is not actually being written to and yet will less strongly resist changes in its state due to a new value being written therein.

An advantageous feature of preferred embodiments of the invention is that the more strongly an individual memory cell tends to resist changes in its state (an individual memory cell may through process or manufacturing variation have such a tendency), then the weakened power supply provided for the memory cells during writing will have an increased effect in enabling a change of state in that memory cell by producing a larger reduction in the supply voltage level output from the power supply control circuit to that memory cell. This write assist technique is accordingly provided with a degree of auto-compensation in respect of individual memory cells to which for some reason it may be more difficult to write.

Whilst the present technique could be used with memory cells having individual power supply circuits, the technique is well suited to integrated circuit memories in which a plurality of memory cells share such a power supply control circuit. Such a plurality of memory cells may conveniently be a column of memory cells within the integrated circuit memory.

Whilst the memory cells themselves can take a variety of different forms, the present technique is particularly useful when the memory cells comprise cross-coupled inverters to which a pair of bit lines apply respective bit values to change the value stored therein. Such memory cells are frequently used within SRAM memories.

Since the memory cells are provided with a weakened power supply when one of the memory cells connected to that power supply is being written, then it is advantageous if none of the other memory cells connected to that power supply are read during that period. This will be the case when the memory is a single ported memory and accordingly the present technique is particularly suited to such memories.

The write assist signals need to be generated to switch the power supply control circuits for the memory cells being written to into the state in which they provide a weakened power supply. Not all of the power supply control circuits within an integrated circuit memory need to be switched and accordingly the required write assist signal(s), targeted at the power supply control circuits(s) associated with the memory cell(s) to be written can be derived from a decoding of the memory address being supplied to the integrated circuit memory as the address of the memory cells to be written.

Viewed from another aspect the present invention provides a method of writing data in an integrated circuit memory, said method comprising the steps of: connecting a memory cell to a supply input via a power supply control circuit having at least a first gate and a second gate, at least one of said first gate and said second gate being switched between a conductive state and a non-conductive state by a write assist signal;

when not writing to a memory cell, switching said power supply control circuit to provide a low resistance path between said memory cell and said supply input; and when writing to said memory cell, switching said power supply control circuit to provide a high resistance path, with a resistance greater than said low resistance path, between said memory cell and said supply input.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
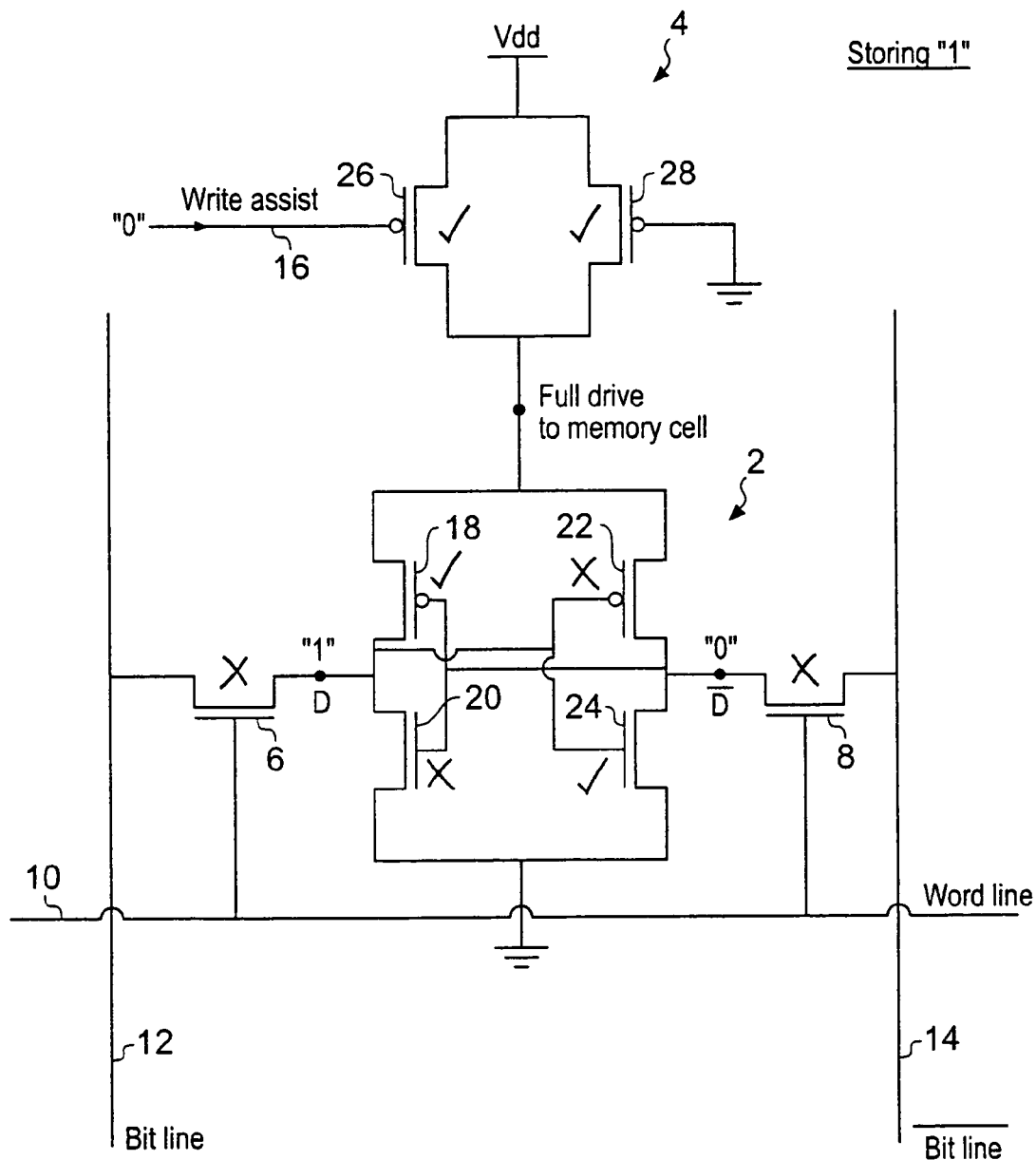
FIG. 1 schematically illustrates a memory cell storing a data value of "1"

FIG. 1 illustrates a portion of an integrated circuit memory comprising a memory cell 2, a power supply control circuit 4, pass gates 6, 8, a word line 10, bit lines 12, 14 and a write assist line 16. The memory cell 2 comprises a pair of cross-coupled inverters formed by transistors 18, 20, 22 and 24. The power supply control circuit 4 comprises a first gate 26. The first gate 26 is switched by the write assist signal on the write assist signal line 16 to be conductive when the memory cell 2 is not being written and to be non-conductive when the memory cell 2 is being written. A second gate 28 is permanently conductive and provides power to the memory cell 2 both when the memory cell 2 is being written and when the memory cell 2 is not being written.

The first gate 26 is a physically larger gate than the second gate 28 and accordingly provides a low(er) resistance path between the power supply Vdd and the memory cell 2. The second gate 28 is physically smaller and is only able to provide a higher resistance path between the power supply Vdd and the memory cell 2. The difference in resistance could alternatively or additionally be provided by different doping levels or other characteristics of the two gates 26, 28. When the write assist signal is not asserted and both the first gate 26 and the second gate 28 are conductive then the path between the power supply Vdd provided at a supply input to the power control supply circuit 4 and the supply output coupled to the memory cell 2 is of a low resistance via both the first gate 26 and the second gate 28 in parallel and accordingly provides full drive to the memory cell 2. This full drive enables the memory cell 2 to securely retain its data value and also to be read from without undue read disturbance effect.

In the state of FIG. 1, the pair of cross-coupled inverters 18, 20, 22, 24 are storing a data value "1" as represented at node D and this is neither being read nor written to.

Figure 2:
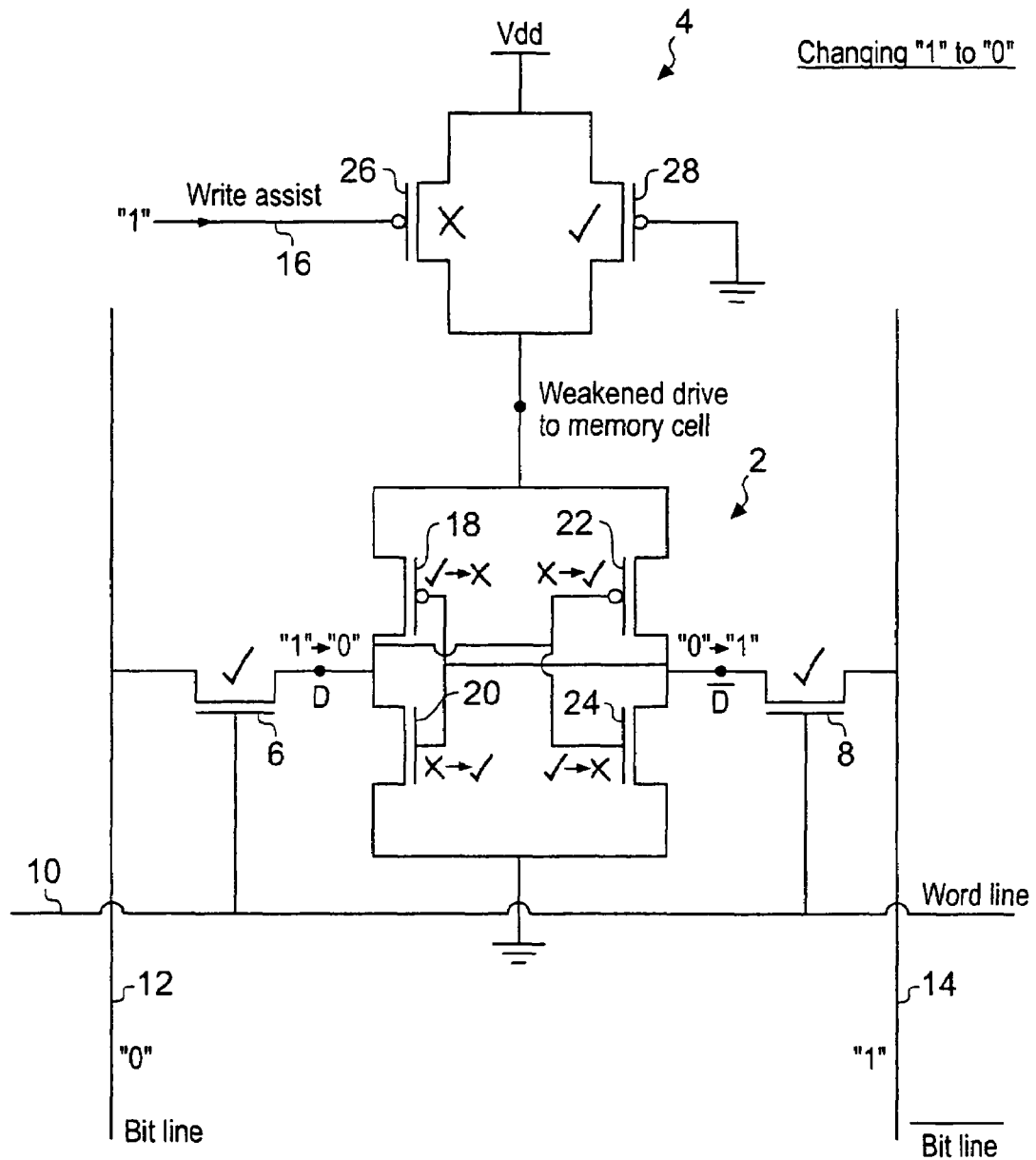
FIG. 2 schematically illustrates a memory cell changing from storing a data value of "1" to "0"

FIG. 2 illustrates writing a value of "0" to the memory cell 2 which was initially storing a data value "1". During this write operation, the write assist signal is asserted on the write assist signal line 16 and serves to switch off the first gate 26 rendering it non-conductive. In this case, the only path between the power supply Vdd and the memory cell 2 is via the second gate 28, which is physically smaller and provides a higher resistance path than was provided in the state illustrated in FIG. 1. Thus, the memory cell 2 is provided with a weakened power drive in the FIG. 2 state.

As illustrated in this example, the signal on the word line 10 for the memory cell 2 is asserted switching on the pass gates 6, 8 and accordingly allowing the signal values being asserted on the bit lines 12, 14 to reach the memory cell 2. The signal "0" on bit line 12 reaches node D via the pass gate 6 and drives the signal value at that node D from "1" to "0". This change is opposed by the inherent stability of the cross-coupled inverters 18, 20, 22, 24 forming the memory cell 2. However, the weakened power supply being provided to the memory cell 2 by the power supply control circuit 4 limits the ability of gate 18 to resist the change in the signal value at node D being driven by the bit line 12 via pass gate 6. The virtual supply voltage being applied to the gate 18 from the output of the power supply control circuit 4 will dip as a crowbar current starts to flow through the cross-coupled inverters 18, 20, 22, 24 as they change state. The action of the gate 18 in resisting the change of state is the main factor which needs to be overcome since once the signal value at node D starts to fall, then gate 24 will start to switch off allowing the signal at node $\bar{D}$.

Figure 3:
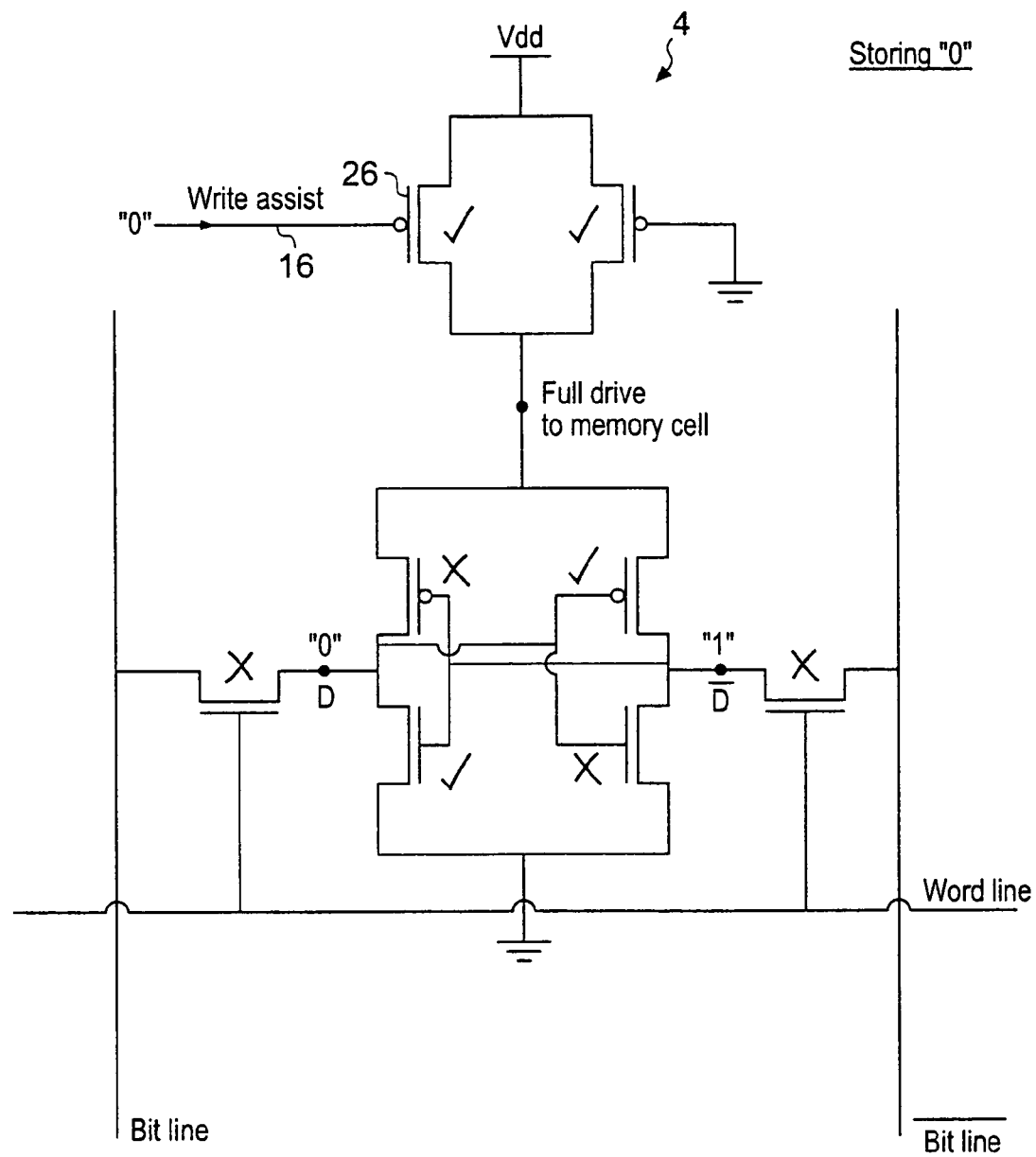
FIG. 3 schematically illustrates a memory cell storing a data value of "0"

FIG. 3 illustrates the stable state reached after the writing of FIG. 2. In this case node D is now storing a "0". The power supply control circuit 4 can be placed into its low resistance state with the first gate 26 being switched back on due to the non-assertion of the write assist signal on the write assist signal line 16.

Figure 4:
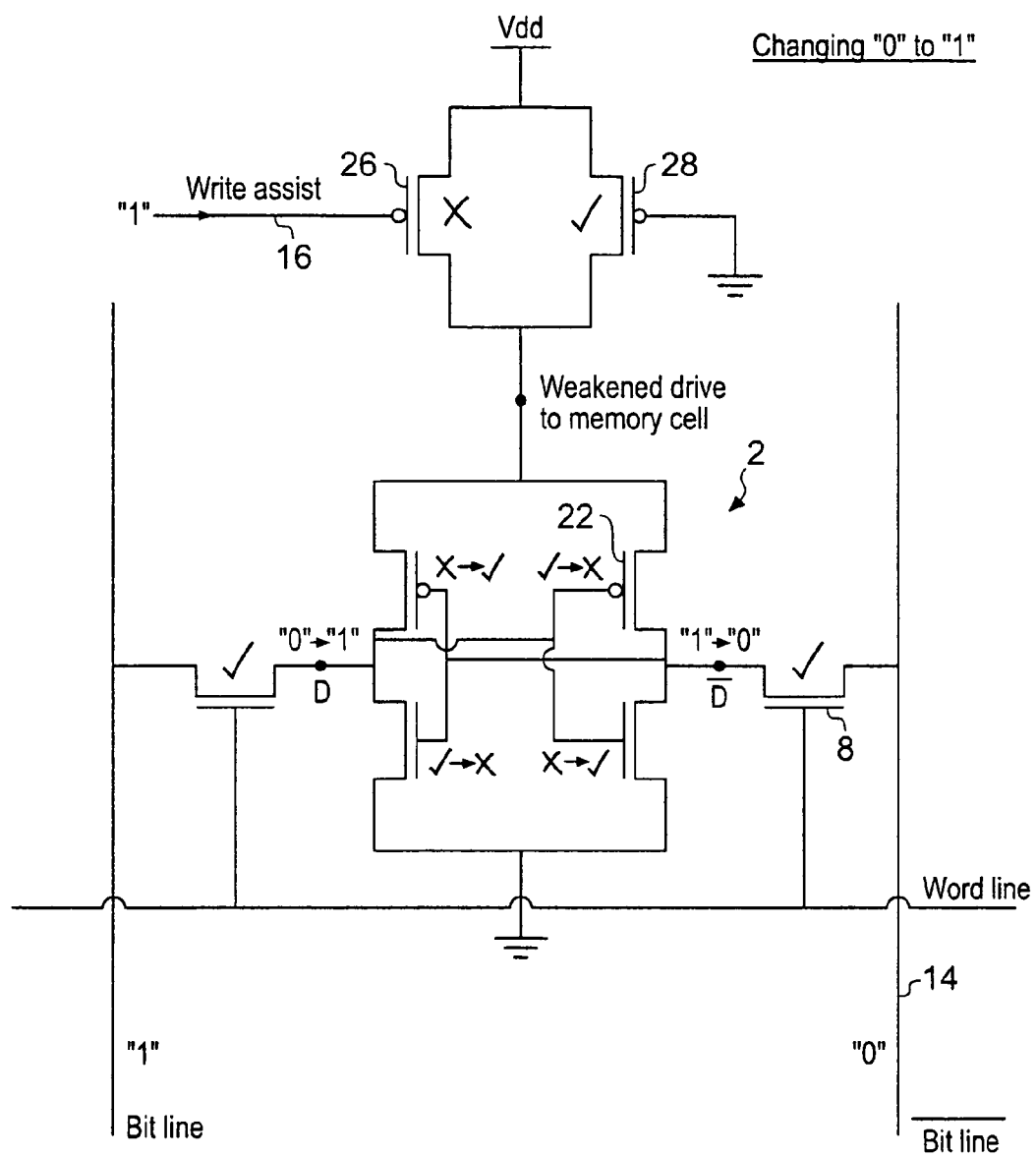
FIG. 4 schematically illustrates a data cell changing from storing "0" to "1"

FIG. 4 illustrates the memory cell 2 again being written but this time changing from storing a "0" to storing a "1". The write assist signal is again asserted on the write assist signal line 16 rendering the first transistor 26 non-conductive while the second transistor 28 remains conductive. The memory cell 2 is still powered but has a weakened drive. Thus, the value "0" being driven into the memory cell 2 on bit line 14 via pass gate 8 is more readily able to force the signal value at node $\bar{D}$ to change to "0" since the ability of transistor 22 to resist this change is undermined by its weakened power supply.

Figure 5:
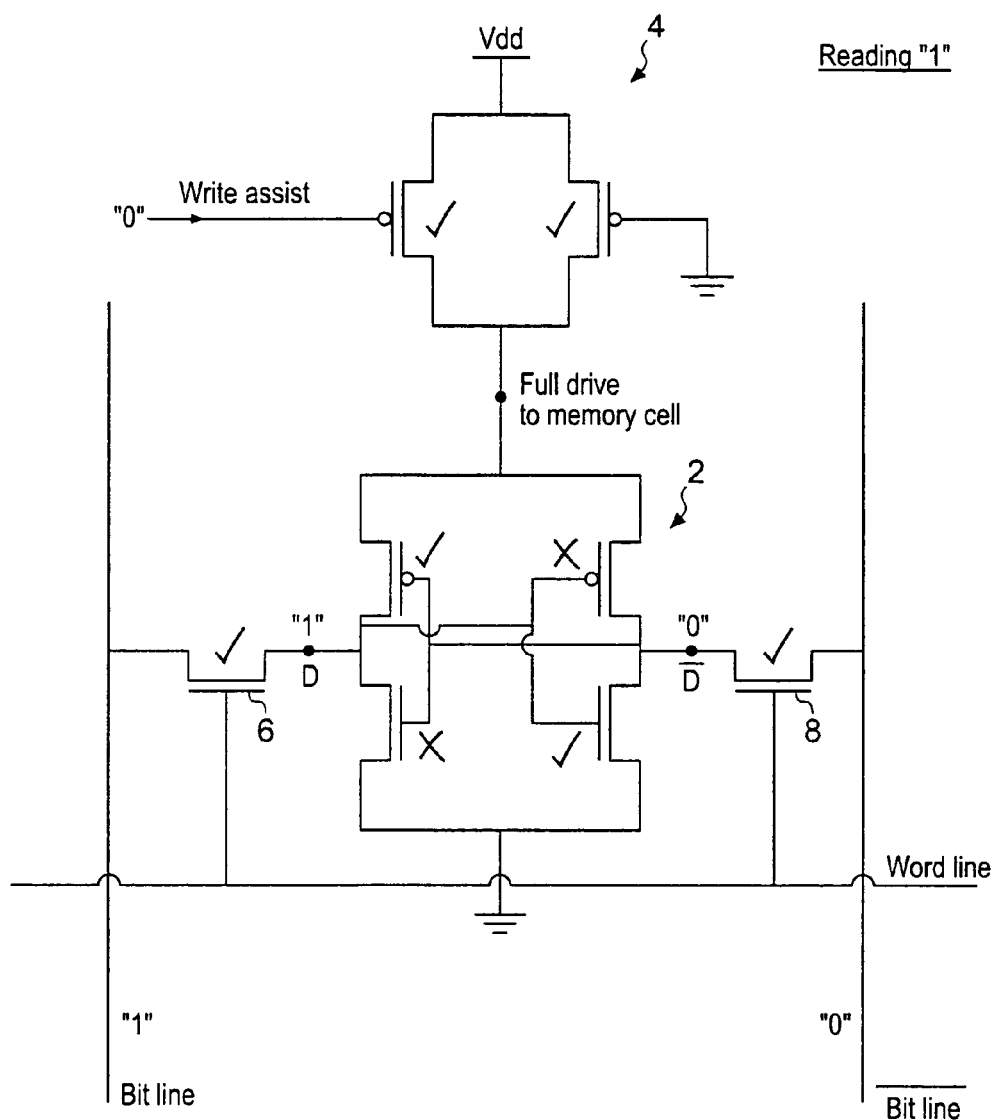
FIG. 5 schematically illustrates reading a memory cell storing a data value "1"

FIG. 5 illustrates the memory cell 2 storing a value "1" being provided with power via the low resistance path through the power supply control circuit 4 and being read with the pass gates 6, 8 conductive.

Figure 6:
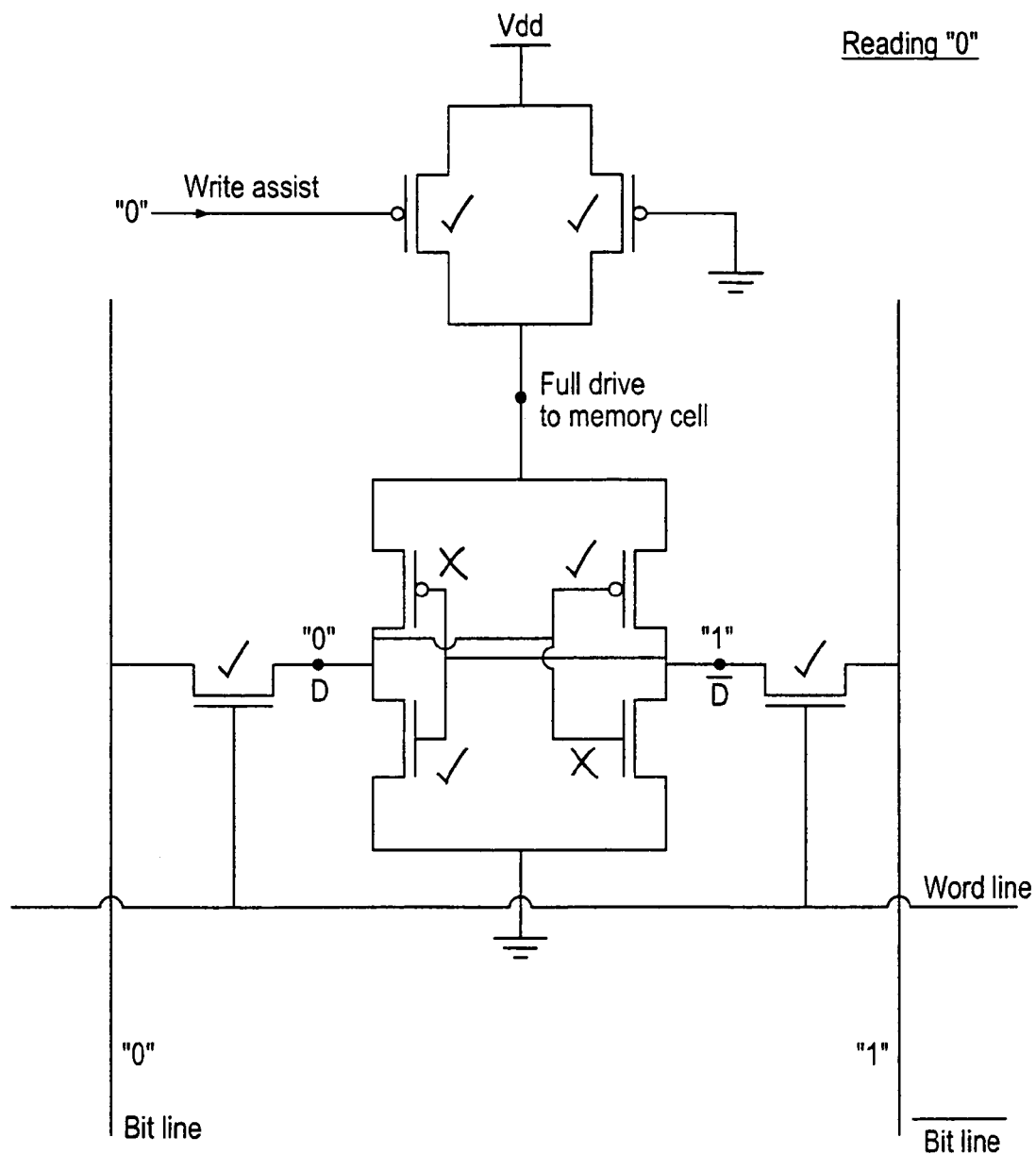
FIG. 6 schematically illustrates reading a memory cell storing a data value "0"

FIG. 6 illustrates the same reading operation, but in this case reading a data value "0".

Figure 7:
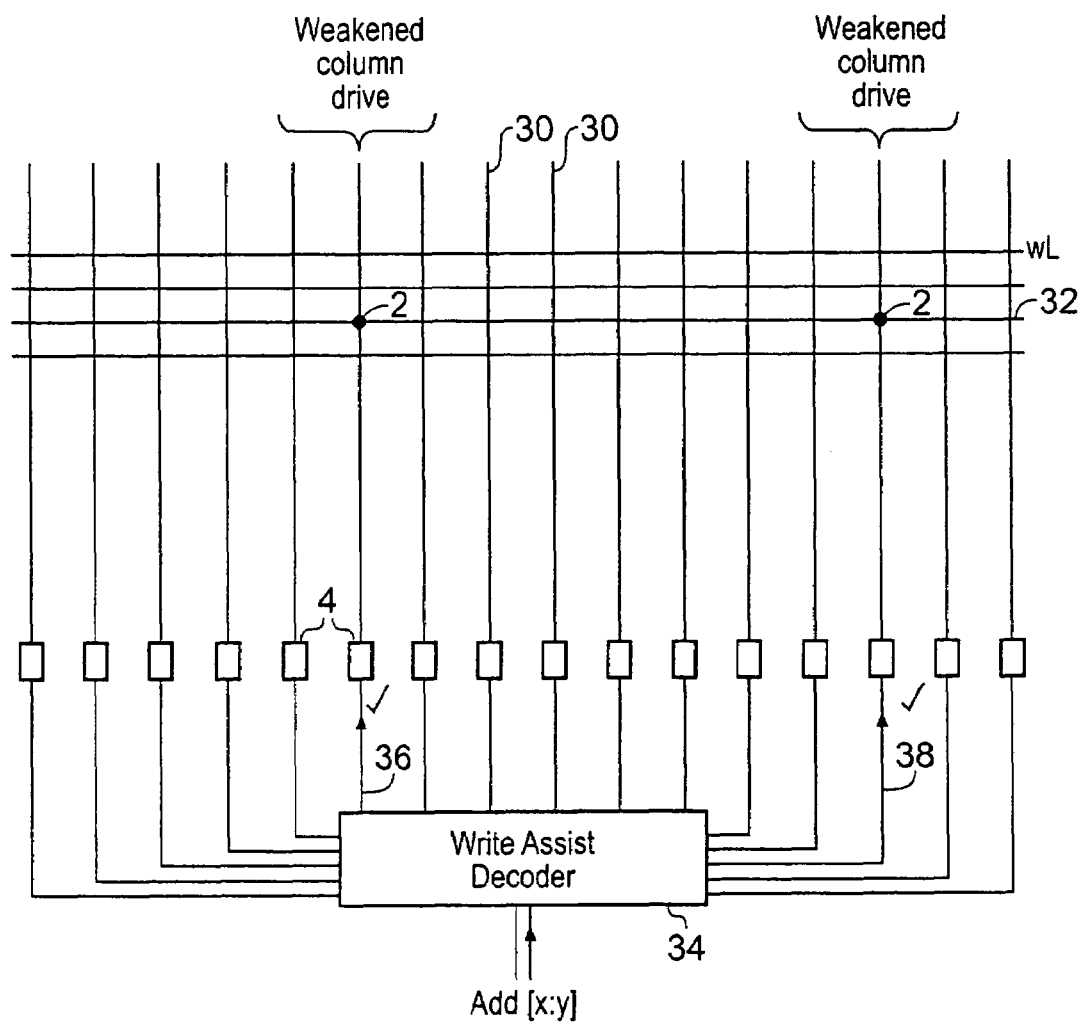
FIG. 7 schematically illustrates decoding a memory address to generate write assist signals.

FIG. 7 illustrates an array of columns of memory cells 30 supplied by respective power supply control circuits 4. In one example, a column of sixty four memory cells 2 share one power supply control circuit 4. The word lines wl run across the rows of memory cells 2. When a data value is to be written to the memory, the relevant word line 32 is asserted and a partial decoding of the write address applied to the integrated circuit memory is performed by a write assist decoder 34 to generate write assist signals 36, 38 for the power supply control circuits 4 of the memory cells 2 being written to by this particular write operation. The write assist decoder 34 will use a portion(s) of the write address depending upon the degree of multiplexing applied within the memory and the individual layout of the memory.

Figure 8:
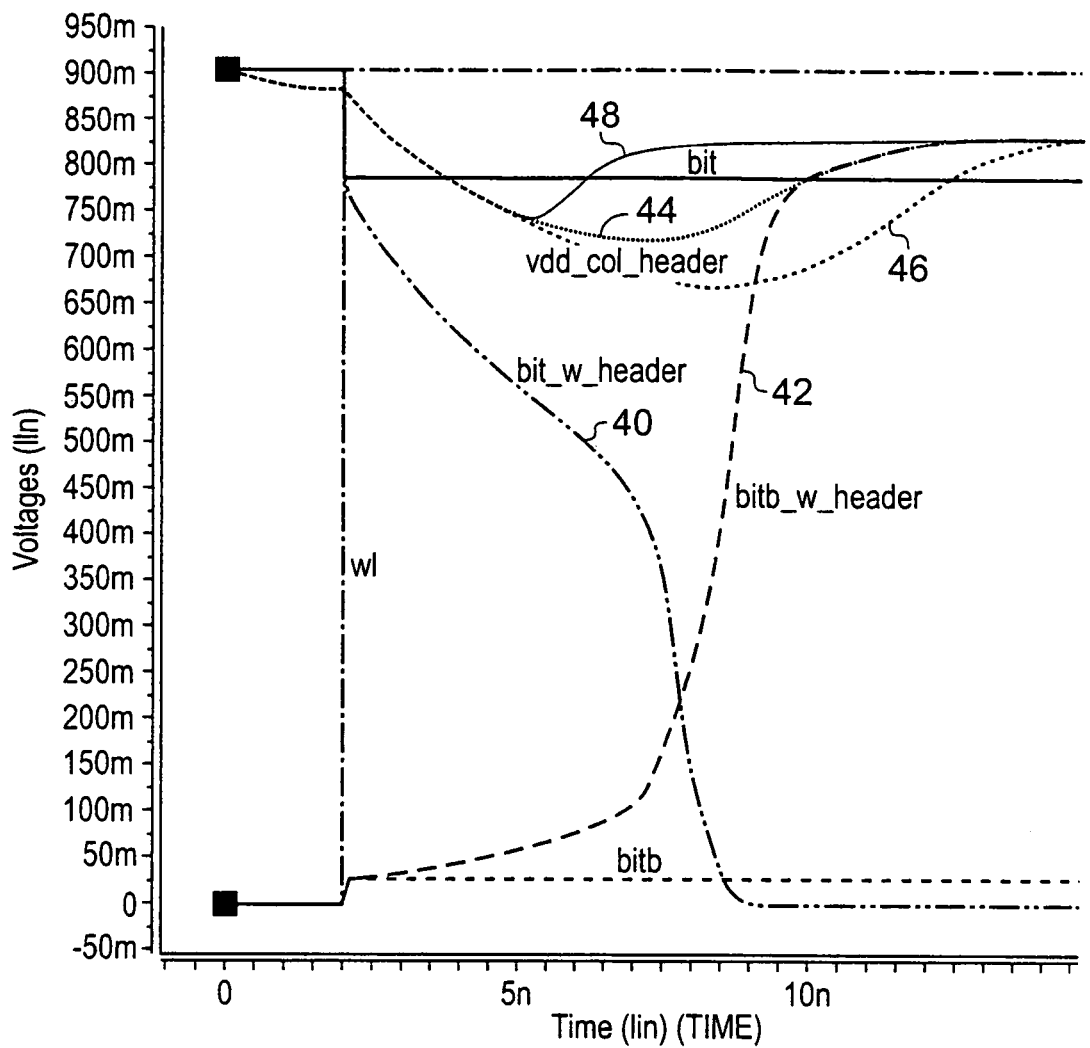
FIG. 8 illustrates voltage waveforms associated with writing data values to a memory cell in accordance with the present technique.

FIG. 8 schematically illustrates voltage waveforms occurring during the writing of a memory cell 2 in accordance with the present techniques. Signal lines 40, 42 illustrate the changes in the values stored at the nodes D and $\bar{D}$ during the progress of a write. Of particular interest is the waveform 44 which shows the variation in the virtual supply voltage provided at the supply output of the power supply control circuit 4 during the progress of a write operation. Since the write assist signal is asserted and the power supply control circuit 4 only provides a high resistance path, this virtual supply voltage dips as the write operation is being made and the cross-coupled inverters 18, 20, 22, 24 within the memory cell 2 seek to resist this change. The current required by the cross-coupled inverters 18, 20, 22, 24 when resisting this change must be drawn through the high resistance path through the power supply control circuit 4 and accordingly a significant voltage loss will occur across the second gate 28 resulting in a dip in the virtual supply voltage at the supply output of the power supply output control circuit 4. This is the dip illustrated in waveform 44. The result of this reduction in the voltage supplied to the cross-coupled inverters is that it becomes easier for the applied bitline signals to overcome the inherent stability of the memory cell and cause it to change state.

If an individual memory cell has due to process or manufacturing variation, one or more transistors therein which act to increase the opposition to changes in state of that memory cell 2, then the present technique to some extent auto-compensates. Memory cells 2 which tend to resist more strongly changes in their state, will also draw more current through the power supply control circuit 4 whilst resisting those changes and the drawing of more current will further reduce the virtual supply voltage in a way which assists the change to actually be made. The amount of dip in the virtual supply voltage illustrated in waveform 44 of FIG. 8 corresponds in this example simulation to such a memory cell 2 which provides an above average resistance to changes in its state. The amount of voltage dip for a more normal memory cell 2 would be less e.g. wave form 48. The amount of voltage dip for an even less normal (i.e. still more resistant to change) memory cell 2 is shown in waveform 46.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit memory comprising:
   at least one memory cell having a first state and a second state corresponding to storage of different values of a data bit; and
   a power supply control circuit operable to supply power to said at least one memory cell and having a supply input coupled to a power source and a supply output coupled to said at least one memory cell; wherein
   said power supply control circuit includes at least a first gate and a second gate and is responsive to a write assist signal to switch at least one of said first gate and said second gate such that:
   when not writing to said at least one memory cell said power supply control circuit provides a low resistance path between said supply input and said supply output; and
   when writing to said at least one memory cell said power supply control circuit provides a high resistance path, with a resistance greater than said low resistance path, between said supply input and said supply output so that said at least one memory cell is more readily switched between said first state and said second state.

2. An integrated circuit memory as claimed in claim 1, wherein said first gate is switched to a conductive state by said write assist signal when not writing to said at least one memory cell.

3. An integrated circuit memory as claimed in claim 1, wherein said first gate is switched to a non-conductive state by said write assist signal when writing to said at least one memory cell.

4. An integrated circuit memory as claimed in claim 1, wherein said second gate remains in a conductive state both when writing to said at least one memory cell and when not writing to said at least one memory cell.

5. An integrated circuit memory as claimed in claim 1, wherein said first gate has a lower resistance when conductive than said second gate when conductive.

6. An integrated circuit memory as claimed in claim 1, wherein, if said at least one memory cell has an increased opposition to changing between said first state and said second state and thereby draws more current through said power supply control circuit whilst changing, then said high resistance path through said power supply control circuit serves to further reduce a supply voltage level at said supply output thereby assisting in changing said at least one memory cell between said first state and said second state.

7. An integrated circuit memory as claimed in claim 1, wherein said power supply control circuit supplies power to a plurality of memory cells.

8. An integrated circuit memory as claimed in claim 7, wherein said integrated circuit memory comprises a plurality of columns each formed of a plurality of memory cells and said power supply control circuit is shared by a plurality of memory cells within a column.

9. An integrated circuit memory as claimed in claim 1, wherein said at least one memory cell comprises a pair of cross-coupled invertors.

10. An integrated circuit memory as claimed in claim 9, wherein a pair of bit lines apply a bit value to change a data value stored by said at least one memory cell by forcing said cross-coupled invertors to switch between said first state and said second state.

11. An integrated circuit memory as claimed in claim 1, wherein said at least one memory cell is a SRAM memory cell.

12. An integrated circuit memory as claimed in claim 1, wherein said integrated circuit memory is a single ported integrated circuit memory.

13. An integrated circuit memory as claimed in claim 1, wherein said write assist signal is generated by decoding at least a portion of an address value supplied to said integrated circuit memory specifying one or more data values to be written.

14. A method of writing data in an integrated circuit memory, said method comprising the steps of:
    connecting a memory cell to a supply input via a power supply control circuit having at least a first gate and a second gate, at least one of said first gate and said second gate being switched between a conductive state and a non-conductive state by a write assist signal;
    when not writing to a memory cell, switching said power supply control circuit to provide a low resistance path between said memory cell and said supply input; and
    when writing to said memory cell, switching said power supply control circuit to provide a high resistance path, with a resistance greater than said low resistance path, between said memory cell and said supply input.

15. A method as claimed in claim 14, wherein said first gate is switched to a conductive state by said write assist signal when not writing to said memory cell.

16. A method as claimed in claim 14, wherein said first gate is switched to a non-conductive state by said write assist signal when writing to said memory cell.

17. A method as claimed in claim 14, wherein said second gate remains in a conductive state both when writing to said memory cell and when not writing to said memory cell.

18. A method as claimed in claim 14, wherein said first gate has a lower resistance when conductive than said second gate when conductive.

19. A method as claimed in claim 14, wherein, if said memory cell has an increased opposition to changing between said first state and said second state and thereby draws more current through said power supply control circuit whilst changing, then said high resistance path through said power supply control circuit serves to further reduce a supply voltage level at said memory cell thereby assisting in changing said memory cell between said first state and said second state.

20. A method as claimed in claim 14, wherein said power supply control circuit supplies power to a plurality of memory cells.

21. A method as claimed in claim 20, wherein said integrated circuit memory comprises a plurality of columns each formed of a plurality of memory cells and said power supply control circuit is shared by a plurality of memory cells within a column.

22. A method as claimed in claim 14, wherein said memory cell comprises a pair of cross-coupled invertors.

23. A method as claimed in claim 22, wherein a pair of bit lines apply a bit value to change a data value stored by said memory cell by forcing said cross-coupled invertors to switch between said first state and said second state.

24. A method as claimed in claim 14, wherein said memory cell is a SRAM memory cell.

25. A method as claimed in claim 14, wherein said integrated circuit memory is a single ported integrated circuit memory.

26. A method as claimed in claim 14, wherein said write assist signal is generated by decoding at least a portion of an address value supplied to said integrated circuit memory specifying one or more data values to be written.

* * * * *